(12) United States Patent
Kraehmer et al.

(10) Patent No.: US 8,213,079 B2
(45) Date of Patent: *Jul. 3, 2012

(54) POLARIZATION-MODULATING OPTICAL ELEMENT AND METHOD FOR MANUFACTURING THEREOF

(75) Inventors: Daniel Kraehmer, Aalen (DE); Ralf Mueller, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/008,282

(22) Filed: Jan. 18, 2011

(65) Prior Publication Data

US 2011/0109894 A1    May 12, 2011

Related U.S. Application Data

(63) Continuation of application No. 11/739,232, filed on Apr. 24, 2007, now Pat. No. 7,903,333.

(30) Foreign Application Priority Data

May 5, 2006 (DE) .......................... 10 2006 021 334

(51) Int. Cl.
  *G02B 13/14* (2006.01)
(52) U.S. Cl. .................................. 359/355; 359/489.03

(58) Field of Classification Search .................. None
See application file for complete search history.

(56) References Cited

U.S. PATENT DOCUMENTS

| 6,191,880 | B1 | 2/2001 | Schuster |
| 6,252,712 | B1 | 6/2001 | Fürter et al. |
| 6,437,916 | B1 | 8/2002 | McLeod et al. |
| 6,879,379 | B2 | 4/2005 | Brunotte et al. |
| 7,755,833 | B2 | 7/2010 | Hembd |
| 7,903,333 | B2 * | 3/2011 | Kraehmer et al. ....... 359/494.01 |

FOREIGN PATENT DOCUMENTS

| DE | 195 35 392 | 9/1995 |
| DE | 103 28 938 | 6/2003 |
| EP | 1 022 617 A2 | 7/2000 |
| WO | WO 2005/001527 | 1/2005 |
| WO | WO 2005/069081 | 7/2005 |

* cited by examiner

*Primary Examiner* — Derek S Chapel
(74) *Attorney, Agent, or Firm* — Fish & Richardson P.C.

(57) ABSTRACT

A method of manufacturing a polarization-modulating optical element is provided. The element causes, for light passing through the element and due to stress-induced birefringence, a distribution of retardation between orthogonal states of polarization. The method includes joining a first component and a second component. A non-plane surface of the first component is provided with a defined height profile is joined with a plane surface of the second component. A mechanical stress causing the stress-induced birefringence is produced in the such formed polarization-modulating optical element.

26 Claims, 5 Drawing Sheets

POLARIZATION-MODULATING OPTICAL ELEMENT AND METHOD FOR MANUFACTURING THEREOF

CROSS-REFERENCE TO RELATED APPLICATIONS

This application is a continuation of U.S. application Ser. No. 11/739,232, filed Apr. 24, 2007, which claims priority to German Application Serial No. 10 2006 021 334.3, filed on May 5, 2006. The contents of these applications are hereby incorporated by reference.

FIELD

The disclosure relates to a polarization-modulating optical element and a method for manufacturing thereof.

In particular, the polarization-modulating optical element according to the disclosure can be used in an illumination system or a projection objective of a microlithographic projection exposure apparatus. This can, for example, at least partially compensate a disturbance of the polarization distribution being present in the optical system.

BACKGROUND

Microlithography is used for the manufacture of microstructured components such as for example integrated circuits or liquid crystal displays (LCDs). The microlithography process is performed in a so-called projection exposure apparatus which includes an illumination system and a projection objective. The image of a mask (also called a reticle) which is illuminated via the illumination system is projected via the projection objective onto a substrate (for example a silicon wafer) which is coated with a light-sensitive coating (for example a photoresist) and set up in the image plane of the projection objective, whereby the mask structure is transferred to the light-sensitive coating of the substrate.

In order to achieve an imaging process which is rich in contrast and of high resolution, the providing of defined polarization distributions is desirable in both the illumination system and the projection objective. However, a problem encountered here is that an initially provided or adjusted polarization distribution in a bundle of light rays passing through the respective optical system is modified due to polarization-modulating effects, in particular stress-induced birefringence being induced by optical mounts, gravitation-induced birefringence, intrinsic birefringence or natural birefringence in the material of the optical components as e.g. lenses, as well as due to polarization-manipulating effects of dielectric layers. These effects result in errors in telecentry and losses in contrast in the optical imaging process due to the introduction of retardations of varying strength into the optical system. The term "retardation" in this context means the difference between the respective optical path lengths for two orthogonal (i.e. mutually perpendicular) states of polarization.

U.S. Pat. No. 6,252,712 B1 discloses an optical system with at least one optical element that causes a disturbance of the distribution of polarization over the cross section of a light beam, wherein at least one birefringent optical element is provided with a thickness that varies irregularly over the cross section such that the disturbance of the distribution of polarization is at least partially compensated. To this, the at least one birefringent optical element is provided with a free form surface via ion beam processing, and at least one plate of isotropic material with a thickness varying over the cross section is used to equalize disturbances of the wave front.

EP 1 022 617 A2 inter alia discloses an optical correction plate to compensate for the residual distortion in a microlithographic projection exposure apparatus, wherein two surfaces of the plate have an identical aspherical profile. In a method of manufacturing the correction plate a plane-parallel plate is sucked against a base surface with the desired aspherical profile, after which the exposed surface is worked flat.

WO 2005/069081 A2 inter alia discloses a polarization-modulating optical element which includes an optically active crystal with an optical axis and which has a thickness profile which, as measured in the direction of the optical axis, is variable.

SUMMARY

The disclosure provides an alternative method of manufacturing a polarization-modulating optical element as well as an alternative realisation of a polarization-modulating optical element such that a local disturbance of the distribution of polarization in an optical system can be at least partially compensated.

A method of manufacturing a polarization-modulating optical element, wherein the element causes, for light passing through the element and due to stress-induced birefringence, a distribution of retardation between orthogonal states of polarization, includes joining a first component and a second component, wherein a non-plane surface of the first component being provided with a defined height profile is joined with a plane surface of the second component, whereby a mechanical stress causing the stress-induced birefringence is produced in the such formed polarization-modulating optical element.

The disclosure is based on the observation that a desired stress-induced birefringence or a distribution of retardation between orthogonal polarization states which is caused by the stress-induced birefringence can be produced in a controlled and predictable manner by joining a non-plane surface of one component with a plane surface of another component, if this joining process results in a forced deformation in at least one of the two components and thereby to the introduction of mechanical stress in this component.

As to the factors which are relevant for the achieved stress-induced birefringence or distribution of retardation, respectively, these factors particularly include, besides the materials and dimensions (in particular thicknesses) of the two components, the exact shape of the non-plane surface, i.e. the height profile (or thickness profile) being present on the non-plane surface at the time of the joining process.

According to a further embodiment of the method of the present disclosure, this shape is pre-calculated in order to achieve a predetermined distribution of retardation.

The polarization-modulating optical element may basically be used for an at least partial compensation of any arbitrary, known two-dimensional distribution of retardation. On the one hand, such a compensation can be a compensation of undesired disturbances of the distribution of polarization, which may occur in the respective optical systems (e.g. projection objectives) in a systematic and substantially constant way, in which case the calculation of the height profile which is to be produced in order to form the non-plane surface can be performed in advance, e.g. on the basis of theoretical knowledge or data.

On the other hand, the polarization-modulating optical element can also be used for a compensation of disturbances of the distribution of polarization which differ from one optical system (e.g. projection objective) to another optical system, e.g. due to the material properties of the lenses being used in the respective system. The use of the polarization-modulating optical element gives the possibility to individually react on special, individual distributions of polarization via making, in a first step, polarization optical measurements (e.g. to determine a relatively complicate distribution of a retardation) and then forming the respective height profile accordingly in order to appropriately adjust a compensating stress-induced birefringence.

This height profile for the formation of the non-plane surface being used according to the disclosure can be formed on an initially plane surface which is already present in the optical system to be corrected, e.g. on the plane surface of a plano-convex or plano-concave lens of an optical subsystem that has to be polarization-optically corrected (e.g. the height profile can be formed on the light exit surface of a last lens on the image side of an immersion objective, which last lens is typically plano-convex). The lens can be temporarily removed for performing the method according to the disclosure. In this case, the further component which includes the plane surface to be joined can be a plane-parallel plate, wherein the plate is joined during the method of the disclosure with the surface being provided with the height profile.

Furthermore, the height profile used to form the non-plane surface according to the disclosure can also be formed on an additional optical element (typically an initially plane-parallel plate). In this case the further component including the plane surface to be joined can also be a plane plate, which is then joined during the method of the disclosure with the surface being provided with the height profile.

Since the desired effect of the polarization-modulating optical element is achieved by the controlled introduction of stress-induced birefringence, the only significant requirements for the materials from which the first or second component, respectively, are made is that these materials are substantially transparent for the desired operating wavelength. Suitable materials for a typical operating wavelength of 193 nm are e.g. fused silica ($SiO_2$) or calcium fluoride ($CaF_2$). If the respective materials also exhibit (intrinsic or natural) birefringence, this birefringence is substantially superimposed to the stress-induced birefringence being used for the compensation according to the disclosure and can also be compensated by appropriately adjusting the distribution of retardation caused by the stress-induced birefringence.

The disclosure also relates to a polarization-modulating optical element which has been manufactured according to the above described method. The disclosure also relates to an optical system, in particular an illumination system or a projection objective of a microlithographic projection exposure apparatus, having at least one polarization-modulating optical element, a method for manufacturing an optical system, a microlithographic projection exposure apparatus, a method for microlithographic manufacturing of micro-structured components as well as a micro-structured component.

Further developments of the disclosure can be found in the description as well as in the subordinate claims.

BRIEF DESCRIPTION OF THE DRAWINGS

The disclosure will hereinafter be explained in more detail through examples which are illustrated in the attached drawings, wherein.

DETAILED DESCRIPTION

In the following, a method for manufacturing of a polarization-modulating optical element as well as the structure of such an element are explained through embodiments and with reference to the illustrations of FIG. 1-5. It is to be noted that these illustrations are just schematic and not true to scale, but have been enlarged for easier illustration.

Figure 1A:
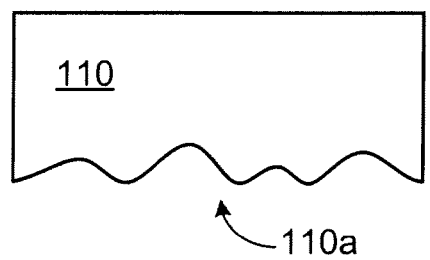
FIG. 1a-d are schematic illustrations to explain a method for manufacturing of a polarization-modulating element according to a first embodiment of the disclosure.

In order to manufacture a polarization-modulating optical element according to a first embodiment, a first component 110 is formed according to FIG. 1a by providing an originally plane-parallel plate on its one surface via controlled removal of material e.g. with ion beam processing with a height profile 110a. Just by way of an example, the thickness of the first component 110 may be 12 mm. For easier illustration, the height profile 110a is shown in the drawings in a schematically simplified as well as strongly enlarged way. Typical dimensions of the height profile 110a can e.g. be in the nanometer region, as further explained below with reference to FIG. 6. The first component 110 is made of a material which is substantially transparent at the desired operating wavelength and is made, according to the first embodiment, of calcium fluoride ($CaF_2$).

Figure 1B:
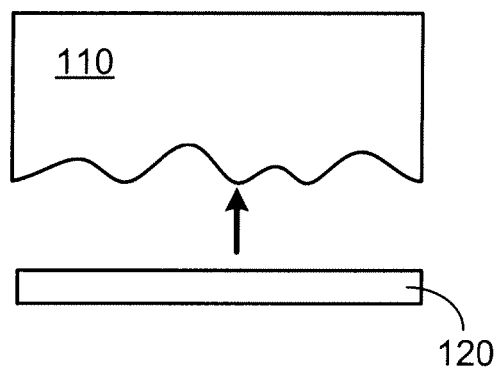

As shown in FIG. 1b, a second component 120 is joined with the surface of the first component 110 including the height profile 110a via optical wringing. With other words, the first component 110 and the second component 120 are substantially seamlessly joined (i.e. substantially without any occlusion of gas or the like between the components 110 and 120). In the second component 120, which according to the first embodiment is also a plane-parallel plate having a thickness being substantially smaller than the thickness of the first component 110, is also made of a material being substantially transparent at the desired operating wavelength and is made, according to the first embodiment, of quartz. Just by way of an example, the thickness of the second component 120 may be 1 mm.

Figure 1C:
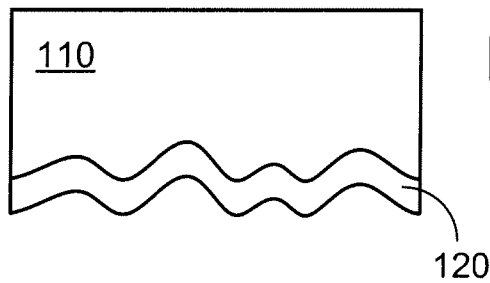

The state obtained after the optical wringing is just schematically shown in FIG. 1c. The wringing of the two components 110 and 120 along the surface of the first component 110 including the height profile 110a causes a deformation of the second component 120, since the second component 120 adapts itself to the height profile 110a, wherein the first component 110 shows practically no deformation due to its substantially larger thickness. With other words, bringing the second, thinner component 120 in contact with the surface of the first component 110 including the height profile 110a and the accompanying deformation of the second component 120 has the effect that the height profile 110a is substantially transmitted to the adjacent surface of the second component 120.

The deformation of the second component 120 which is shown in FIG. 1c and which results from the wringing to the surface of the first component 110 which has been provided before with the height profile 110*a* causes in the second component 120 a mechanical stress and thereby results in a stress-induced birefringence in the second component 120, if the same is inserted into or arranged in the light path of an optical system, in particular the light path of an illumination system or a projection objective of a microlithographic projection exposure apparatus. The concrete distribution of this stress-induced birefringence, or the distribution of the retardation caused by this stress-induced birefringence across the cross section of a light bundle, depends on the specific height profile 110*a*, which was created in the first component 110 at the beginning of the method of the disclosure (see FIG. 1*a*). According to the disclosure, this height profile 110*a* is prepared in the first component 110 in such a way that after arriving at the structure illustrated in FIG. 1*c*, a desired or predetermined distribution of the stress-induced birefringence is obtained as illustrated further below in more detail.

Figure 1D:
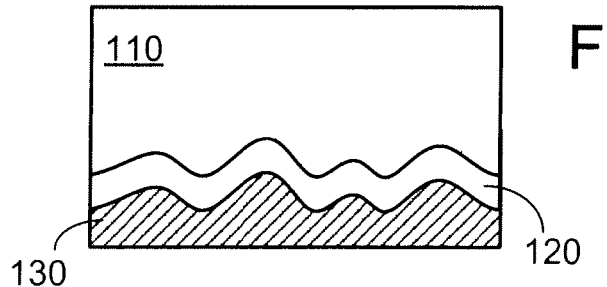

A further consequence of the processing steps of FIG. 1*a-c* (which consequence is usually not desired) is a modification of the wave front which passes through the optical element of FIG. 1*c*. In order to compensate this effect and according to certain embodiments of the disclosure, a wave front compensation structure is formed, which substantially compensates a modification of the wave front of light passing through the first component 110 and the second component 120 after these components have been joined. According to the first embodiment, this wave front compensation structure is applied, as illustrated in FIG. 1*d*, as a wave front compensation plate 130 made from optically isotropic material (e.g. fused silica) and having the corresponding optically negative form (i.e. an optically complementary thickness distribution across the cross section of a light bundle). According to FIG. 1*d*, the wave front compensation plate 130 is applied to the bare or exposed surface of the second component 120 via optical wringing.

Figure 3:
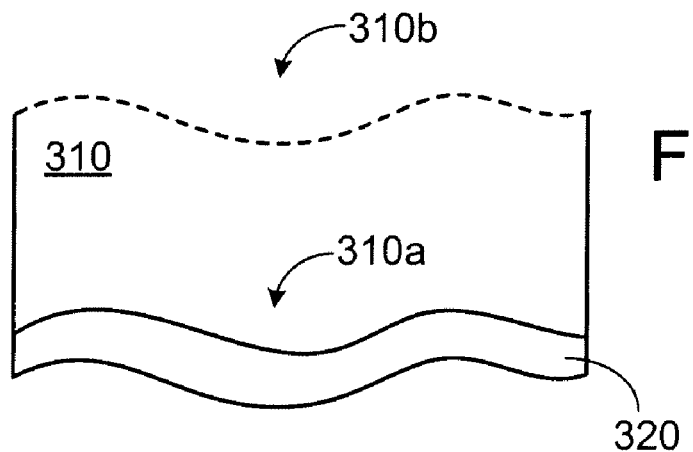
FIG. 3-5 are schematic illustrations of a polarization-modulating optical element according to further embodiments of the disclosure.

According to an alternative embodiment illustrated in FIG. 3, a polarization-modulating optical element obtained by combining a first component 310 having a height profile 310*a* with a second component 320 can also be provided with a wave front compensation structure 310*b* directly at the surface of the first component 310 which is located opposite to the joining face, e.g. via a controlled removal of material (such as ion beam processing).

Figure 2A:
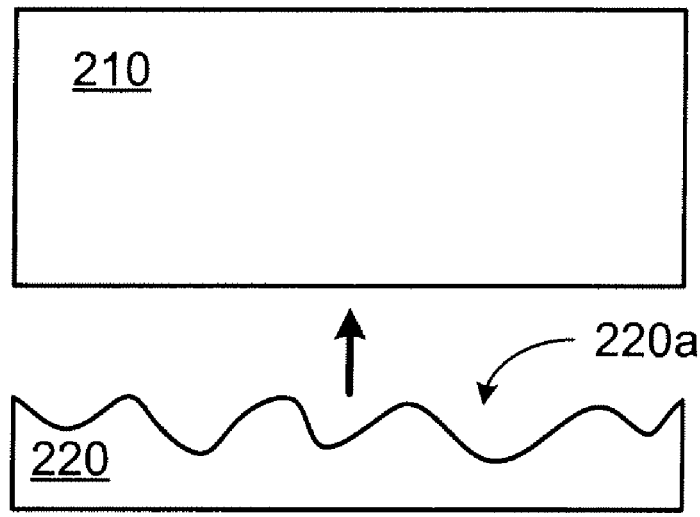
FIG. 2a-b are schematic illustrations to explain a method for manufacturing of a polarization-modulating optical element according to a second embodiment of the disclosure.
Figure 2B:
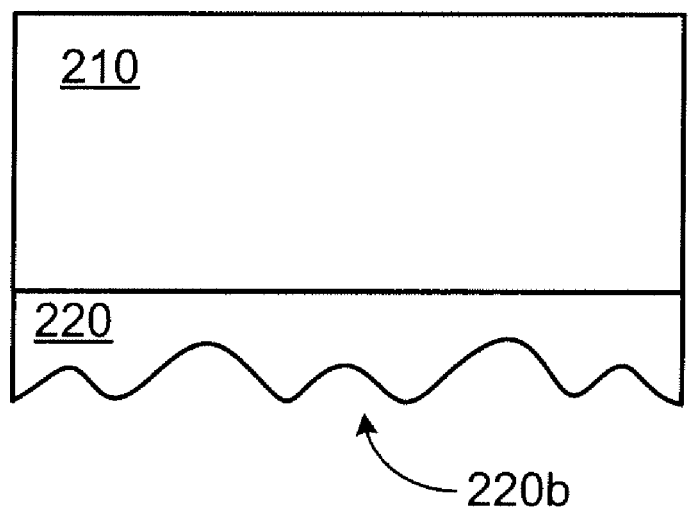

According to a further embodiment illustrated in FIG. 2*a-b*, a polarization-modulating optical element can also be formed by providing a first component 220, the first component 220 having the shape of a plane-parallel plate and a thickness being substantially smaller compared to a second component 210, with a height profile 220*a* (which is also illustrated in FIG. 2 in a schematic and strongly enlarged manner), and then wringing this first component 220 along its surface being provided with the height profile 220*a* to a plane surface of the second component 210 (which is also plane-parallel in the example of FIG. 2*a*).

In this case the process of wringing causes, as illustrated in FIG. 2*b* in a strongly simplified way, a deformation of the first component 220, which substantially adapts itself, due to its relatively low thickness, to the plane surface of the second component 210 and thereby forms on its opposite surface a height profile 220*b*, whereas the second component 210 practically shows no deformation due to its significantly larger thickness.

The deformation of the surface of the first component 220, which previously was provided with the height profile 220*a*, obtained as a result of the wringing fit with the plane surface of the second component 210 as illustrated in FIG. 2*b* causes a mechanical stress in the first component 220 and thereby causes a stress-induced birefringence in the first component 220, if the same is inserted into or arranged in the light path of an optical system, in particular the light path of an illumination system or a projection objective of a microlithographic projection exposure apparatus. The concrete distribution of this stress-induced birefringence, or the distribution of the retardation caused by this stress-induced birefringence, respectively, across the cross section of a light bundle depends on the specific height profile 220*a* which has been prepared in the first component 220 at the beginning of the method of the disclosure (see FIG. 2*a*).

The polarization-modulating optical element made according to FIG. 2*a-b* can also be further provided with a wave front compensation structure analogously to the embodiments according to FIG. 1*d* or FIG. 3.

In the embodiments illustrated in FIG. 1*a-d* and FIG. 2*a-b*, the component 110 or 210, respectively, having a significantly larger thickness compared to the respective other component 120 or 220, respectively, is a plane-parallel plate (which is worked in the embodiment of FIG. 1 to become non-planar via providing a height profile 110*a*). The disclosure is however not restricted thereto. It is rather significant that this (thicker) component includes, prior to the wringing process (according to FIG. 2*a*) or the controlled preparation of a height profile (according to FIG. 1*a*) at least one substantially planar surface. Accordingly, as illustrated in FIG. 4 and FIG. 5 the component having a significantly larger thickness can also be a component which initially (i.e. prior to a possible preparation of a height profile) is a plano-convex lens 410 (see FIG. 4) or plano-concave lens 510 (see FIG. 5) with which a plane-parallel component 420 or 520, respectively, is joined via wringing according to the method described with reference to FIG. 1*a-c*.

Figure 4:
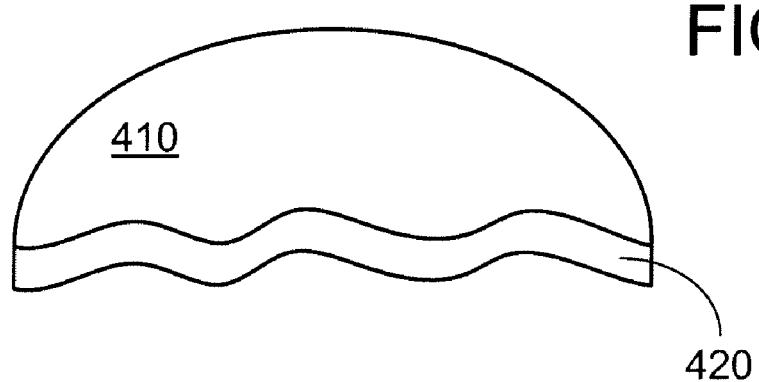
Figure 5:
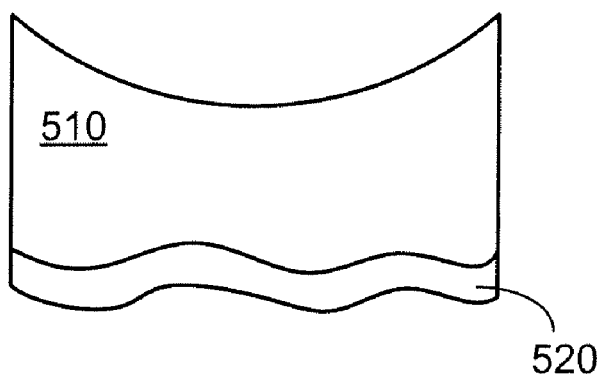

The polarization-modulating optical elements illustrated in FIGS. 4 and 5 can also be provided with a wave front compensation structure analogously to the embodiments of FIG. 1*d* or FIG. 3.

Figure 6A:
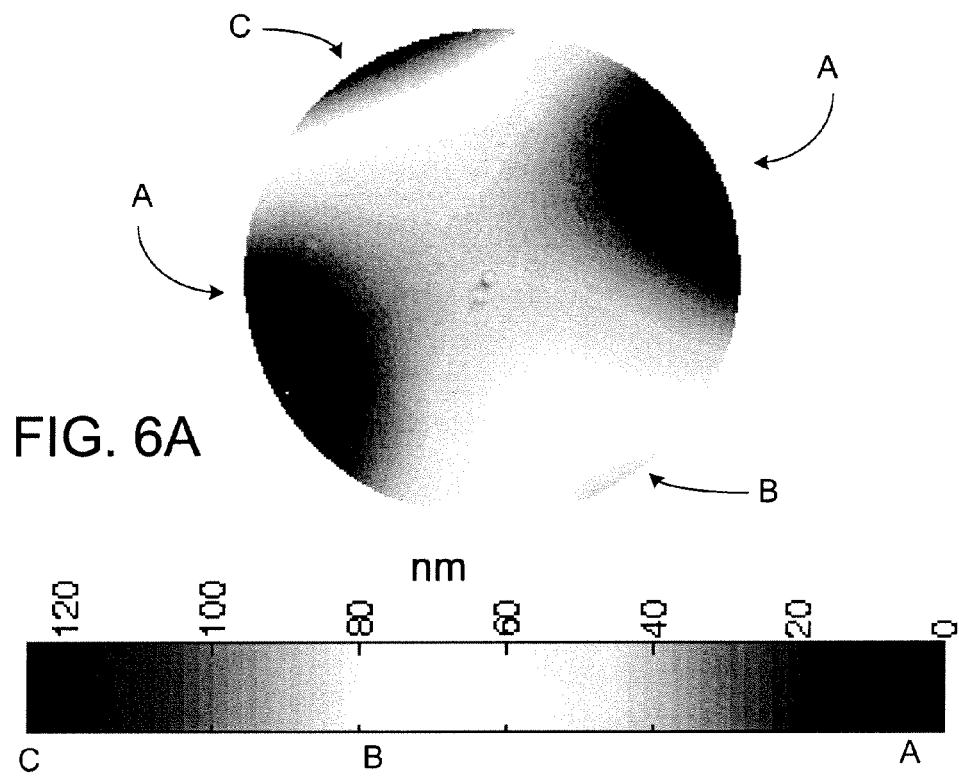
FIG. 6a-b shows, for an exemplarily deformation (FIG. 6a) of an (initially plane-parallel) quartz plate, a distribution of retardation (FIG. 6b) being produced in the quartz plate via stress-induced birefringence as a result of the method of the disclosure.

FIG. 6*a* shows an exemplarily deformation determined by measurement of a quartz plate which initially (i.e. prior to deformation) had a plane-parallel shape.

Figure 6B:
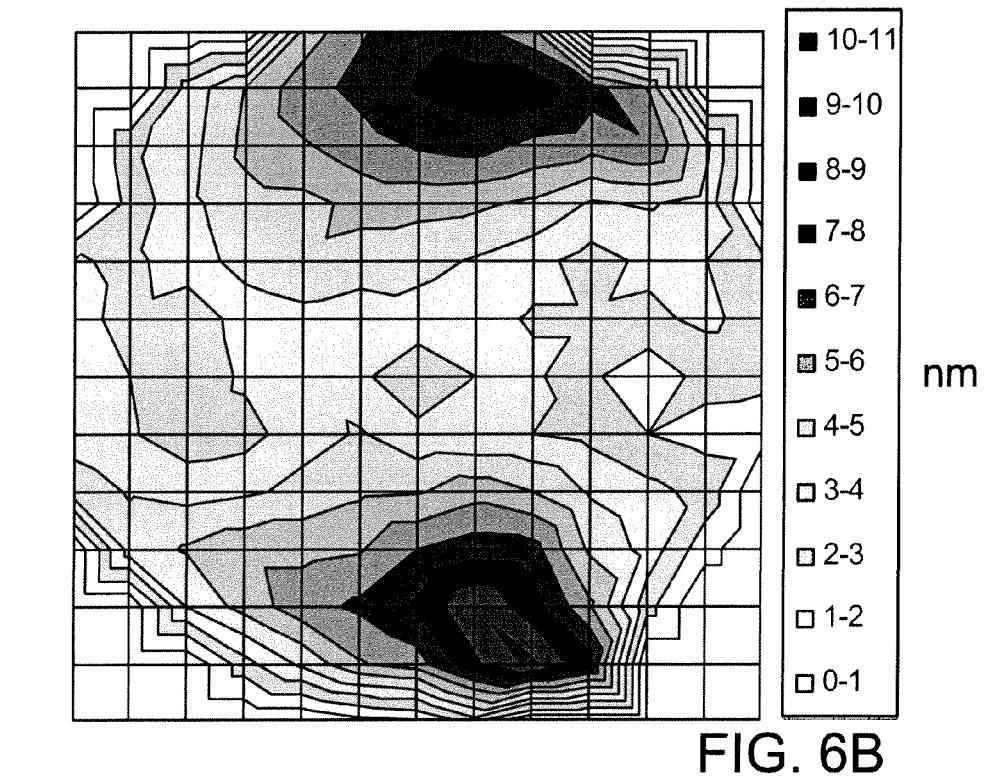

The scale is given in nanometers (nm), and regions A, B and C have been indicated for better explanation, wherein A is a region of comparatively low deformation, B is a region of medium deformation and C is a region of comparatively large deformation. FIG. 6*b* shows the distribution of retardation (in nm) obtained due to stress-induced birefringence in this quartz plate as a consequence of the method of the present disclosure according to the embodiment of FIG. 2. It can be seen that the deformations produced according to FIG. 6*a*, which are in the order of 100 nm, result in retardation values in the region of approximately 0-10 nm.

In the following an explanation is given how a height profile which is to be formed during the manufacturing of a polarization-modulating optical element (according to FIG. 1*a* or FIG. 2*a*) can be determined from the desired distribution of stress-induced birefringence:

If a deformed surface (e.g. the deformed surface of the component 110 of FIG. 1*a*) is described via a mathematical function $d(x,y)$, then the stress-induced birefringence which is created according to the disclosure by making use of this deformed surface (i.e. according to the example of FIG. 1 in the thinner component 120 as a consequence the stress-induced birefringence due to the wringing process) corresponds to the curvature of this deformation. Consequently, the following relation between, on the one hand, a matrix of curvature describing the deformation or the height profile and, on the other hand, the matrix B(x, y) describing the stress-induced birefringence can be assumed:

$$B(x, y) = \alpha \cdot \begin{pmatrix} \frac{\partial^2}{\partial x^2} & \frac{\partial^2}{\partial x \partial y} \\ \frac{\partial^2}{\partial x \partial y} & \frac{\partial^2}{\partial y^2} \end{pmatrix} d(x, y), \quad (1)$$

wherein α is a constant that only depends on the material. The obtained stress-induced birefringence is proportional to the difference between the eigenvalues of the matrix B(x,y), while the fast axis and the slow axis of birefringence are given by the two respective eigenvectors.

Furthermore, any arbitrary distribution of retardation (i.e. also the predetermined or desired distribution of retardation which shall be created via stress-induced birefringence) can be described in a series expansion and factorised to vector modes according to the general relation $$R(p, q) \approx \sum_i v_i V_i(p, q), \quad (2)$$

provided that the system of vector modes $V_i(p,q)$ is mathematically complete, wherein $v_i$ denote superposition coefficients.

Such a complete orthogonal system of mathematical functions is particularly formed by the vector modes being referred to in the following as Zernike modes $$V_{jx} = \begin{pmatrix} U_j(p, q) \\ 0 \end{pmatrix} \text{ and } V_{jy} = \begin{pmatrix} 0 \\ U_j(p, q) \end{pmatrix} \text{ with} \quad (3)$$

$$U_j(p, q) = R_n^m(r)\Phi(l\theta), \quad j = (n, m, l) \quad (4)$$

wherein Zernike polynomials are also used for the components $U_j$. A corresponding method for factorization of a distribution of retardation into vector modes is described in the patent application U.S. 60/641,422, filed Jan. 5, 2005, the contents of which being incorporated in the disclosure of the present application via incorporation by reference.

Accordingly, any arbitrary distribution of stress-induced birefringence $DB_n(x,y)$ which results from a Zernike-deformation Zn can be described as $$DB_n(x, y) = \sum_i K_{ni} \cdot V_i(x, y). \quad (5)$$

Table 1 shows for some deformations of this kind the corresponding distribution of stress-induced birefringence.

TABLE 1

| Surface deformation | Zernike modes of corresponding distribution of stress-induced birefringence |
|---|---|
| Z5 = $x^2 - y^2$ | $\begin{pmatrix} 1 \\ 0 \end{pmatrix}$ |
| Z6 = 2xy | $\begin{pmatrix} 0 \\ 1 \end{pmatrix}$ |
| Z7 = $(3r^2 - 2)x$ | $12r \cdot \begin{pmatrix} \cos \varphi \\ \sin \varphi \end{pmatrix}$ |
| Z8 = $(3r^2 - 2)y$ | $12r \cdot \begin{pmatrix} -\sin \varphi \\ \cos \varphi \end{pmatrix}$ |
| Z9 = $6r^4 - 6r^2 + 1$ | $48r^2 \cdot \begin{pmatrix} \cos 2\varphi \\ \sin 2\varphi \end{pmatrix}$ |

Vice versa, a distribution of retardation being described by the vector mode $V_j(x, y)$ can be mathematically described as a superposition of Zernike-deformations in the expression $$V_j(x, y) = \sum_n (K^{-1})_{jn} \cdot DB_n(x, y) \quad (6)$$

provided that the vector mode $V_j(x,y)$ is included in at least one equation of the system of equations (5). It is now possible to calculate for a sufficiently large number of Zernike-deformations the corresponding distribution of stress-induced birefringence, i.e. a sufficiently large portion of the (infinite) matrix $K_{ni}$, which represents the so-called "crosstalk matrix" and illustrates which distribution of stress-induced birefringence results from the respective distributions of deformation. By way of an example, the above-mentioned Z7-deformation results in a defined distribution of stress-induced birefringence. The corresponding calculation for all n deformations then gives, if written in matrix form, the matrix $K_{ni}$. Here it is assumed that the matrix $K_{ni}$ is quadratic and non-singular (invertible), which e.g. is true the Zernike-deformations Z5 to Z9 (since in this case the matrix $K_{ni}$ is even diagonal).

A distribution of stress-induced birefringence factorised in these vector modes $V_j(x, y)$ $$DB(x, y) = \sum_j \alpha_j \cdot V_j(x, y) \quad (7)$$

can therefore be described as a superposition of Zernike-deformations:

$$DB(x, y) = \sum_j \alpha_j \sum_n (K^{-1})_{jn} \cdot DB_n(x, y) = \sum_n \sum_j \alpha_j (K^{-1})_{jn} \cdot DB_n(x, y). \quad (8)$$

The amplitude $\Delta_n$ of the Zernike-deformation n is then given as $$\Delta_n = \sum_j \alpha_j (K^{-1})_{jn}. \quad (9)$$

In this way it is possible to determine, for a desired distribution of stress-induced birefringence DB(x,y), the deformation which is necessary to produce this distribution of stress-induced birefringence via the method of the disclosure.

Figure 7:
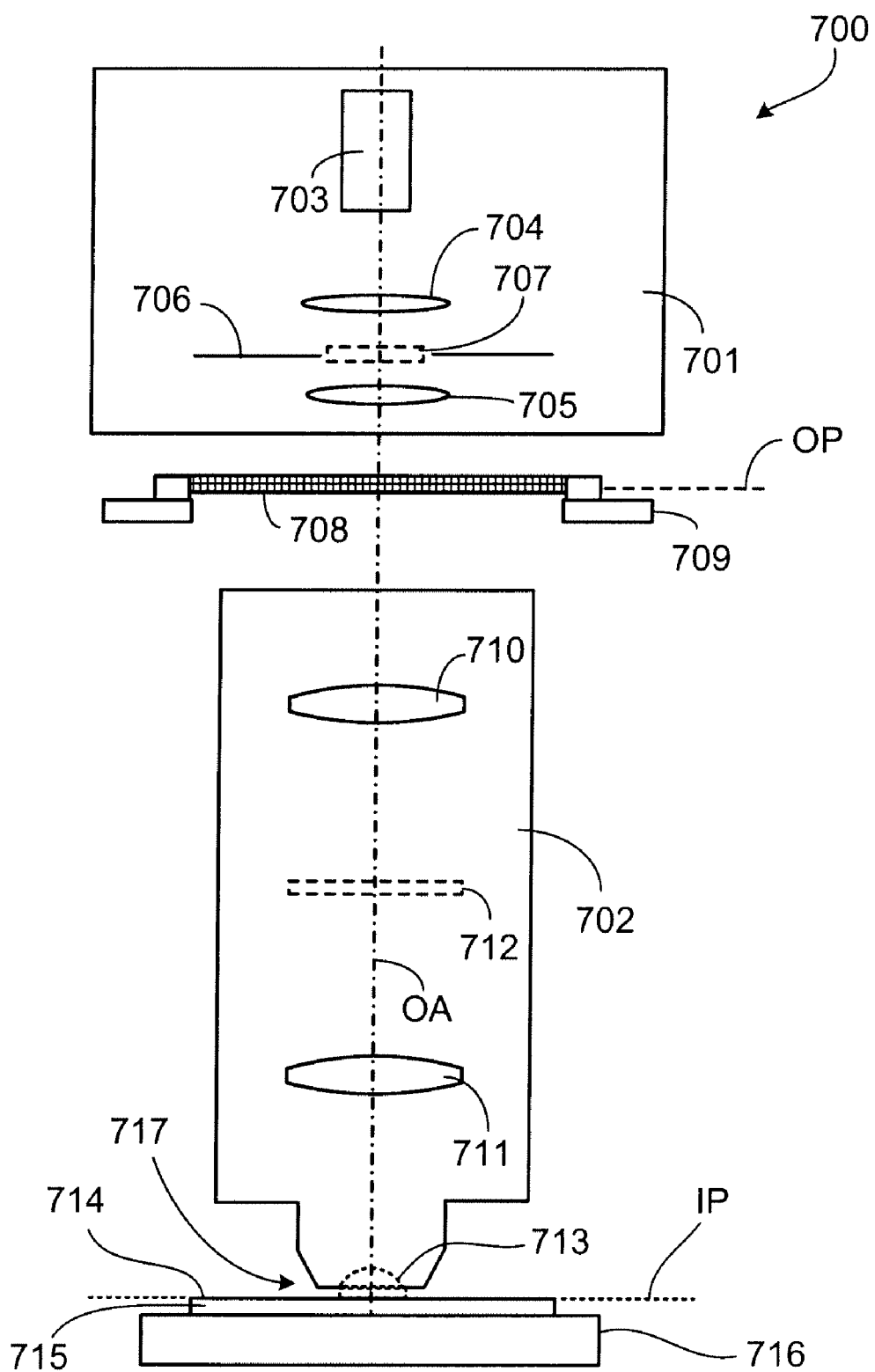
FIG. 7 shows a schematic illustration of a microlithographic projection exposure apparatus.

FIG. 7 shows a schematic illustration of the principal structure of a microlithographic projection exposure apparatus 700. The projection exposure apparatus 700 includes an illumination system 701 and a projection objective 702. The illumination system 701 includes a light source 703 and an illumination optical system which is symbolised, in a strongly simplified way, via lenses 704, 705 as well as an aperture stop 706. In the illustrated example the operating wavelength of the projection exposure 700 is approximately 193 nm, if an ArF-excimer laser is used as light source 703. The operating wavelength can e.g. also be 248 nm by using a KrF-excimer laser, or 157 nm by using a $F_2$-laser as light source 703. The position of a first polarization-modulating optical element 707 is indicated by broken lines in the pupil plane of the illumination system 701, wherein this element 707 is formed according to the present disclosure and can e.g. have the structure as schematically illustrated in FIG. 1d.

A mask (or reticle) 708 is arranged between the illumination system 701 and the projection objective 702 in the object plane OP of the projection objective 702 and is held in the light path via a mask holder 709. The mask 708 carries a structure in the micrometer or nanometer range which is projected via the projection objective 702 onto an image plane IP, reduced for example by a factor of 4 or 5.

The projection objective 702 includes a lens arrangement outlined only schematically via lenses 710, 711 and 713. The position of a second polarization-modulating optical element 712 is indicated by broken lines in a pupil plane of the projection objective 702, wherein this element 712 is formed according to the disclosure and can e.g. have the structure as schematically illustrated in FIG. 1d. The last optical element on the image side, which is also illustrated in broken lines and which has the shape of a plano-convex lens 713, is also a polarization-modulating optical element according to the disclosure and can e.g. have the structure as schematically illustrated in FIG. 4. A substrate or wafer 715 carrying a light sensitive layer 714 and having a position being defined by a substrate holder 716 is arranged in the image plane IP of the projection objective 702. An immersion medium or immersion liquid 717 is arranged between the last optical element 712 on the image side of the projection objective 702 and the light sensitive layer 714.

Even though the disclosure has been described through the presentation of specific embodiments, those skilled in the pertinent art will recognize numerous possibilities for variations and alternative embodiments, for example by combining and/or exchanging features of individual embodiments. Accordingly, it will be understood that such variations and alternative embodiments are considered as being included in the present disclosure and that the scope of the disclosure is limited only by the attached patent claims and their equivalents.

The invention claimed is:

1. An optical element, comprising:
   a first component; and
   a second component joined with the first component to form an interface between the first and second components so that the optical element has a stress-induced birefringence,
   wherein:
   the first component has an average thickness measured along a first direction;
   the second component has an average thickness measured along the first direction;
   the average thickness of the second component is at least 10 times greater than the average thickness of the first component;
   the stress-induced birefringence of the optical element is at least substantially localized in the first component;
   the optical element is a polarization-modulating optical element; and
   the optical element is configured to be used in microlithography by transmitting exposure light through the interface during use of the optical element.

2. The optical element according to claim 1, wherein the stress-induced birefringence of the optical element is localized only in the first component.

3. The optical element according to claim 1, wherein, due to the stress-induced birefringence of the optical element, light passing through the optical element has a distribution of retardation between orthogonal states of polarization.

4. The optical element according to claim 1, wherein the average thickness of the second component is at least 15 times greater than the average thickness of the first component.

5. The optical element according to claim 1, wherein the average thickness of the second component is at least 20 times greater than the average thickness of the first component.

6. The optical element according to claim 1, wherein the first and second components are joined with each other by wringing.

7. The optical element according to claim 1, wherein the first component is a plano-convex lens, or the second component is a plano-convex lens.

8. The optical element according to claim 1, wherein the first component is a plano-concave lens, or the second component is a plano-concave lense.

9. The optical element according to claim 1, further comprising a wave front compensation structure configured to at least partially compensate a modification of a wave front existing after joining the first and second components.

10. An optical system, comprising:
    a polarization-modulating optical element according to claim 1,
    wherein the optical system is a microlithography optical system.

11. The optical system according to claim 10, wherein the optical system is a projection objective.

12. The optical system according to claim 10, wherein the optical system is an illumination system.

13. The optical system according to claim 10, further comprising an optical element configured to cause a disturbance of a distribution of polarization, wherein the polarization-modulating optical element is configured to at least partially compensate the disturbance of the distribution of polarization.

14. The optical system according to claim 10, wherein the optical system has a field plane and a pupil plane, and the polarization-modulating optical element is arranged at least close to the field plane or the pupil plane.

15. The optical system according to claim 10, further comprising an additional polarization-modulating optical element according to claim 1 so that the optical system comprises a first polarization-modulating element and a second polarization-modulating optical element, wherein the first polarization-modulating optical element is arranged at least close to a pupil plane of the optical system, and the second polarization-modulating optical element is arranged at least close to a field plane of the optical system.

16. The optical system according to claim 15, wherein the optical system is a projection objective.

17. The optical system according to claim 15, wherein the optical system is an illumination system.

18. An apparatus, comprising:
an illumination system; and
a projection objective,
wherein:
the apparatus is a microlithographic projection exposure apparatus;
at least one optical system of the microlithographic projection exposure apparatus comprises the optical element of claim 1; and
the at least one optical system of the microlithographic projection exposure apparatus is selected from the group consisting of the illumination system and the projection objective.

19. The apparatus according to claim 18, wherein the illumination system comprises the optical element.

20. The apparatus according to claim 18, wherein the projection objective comprises the optical element.

21. The apparatus according to claim 20, wherein:
the projection objective further comprises an additional polarization-modulating optical element according to claim 1 so that the projection objective comprises a first polarization-modulating element and a second polarization-modulating optical element;
the first polarization-modulating optical element is arranged at least close to a pupil plane of the projection objective; and
the second polarization-modulating optical element is arranged at least close to a field plane of the projection objective.

22. A method, comprising:
providing a microlithographic projection exposure apparatus, comprising:
an illumination system; and
a projection objective; and
using the microlithographic projection exposure apparatus to manufacture micro-structured components,
wherein:
at least one optical system of the microlithographic projection exposure apparatus comprises the optical element according to claim 1; and
the at least one optical system of the microlithographic projection exposure apparatus is selected from the group consisting of the illumination system and the projection objective.

23. The method of claim 22, wherein the method comprises using the projection objective to project at least a part of a mask onto an area of a coating.

24. The method of claim 22, wherein the method comprises using the illumination system to illuminate at least the part of the mask.

25. The optical element of claim 1, wherein the first and second components are optically transparent.

26. The optical element of claim 1, wherein during use, light is transmitted through both of the first and second components.

* * * * *

UNITED STATES PATENT AND TRADEMARK OFFICE
CERTIFICATE OF CORRECTION

PATENT NO.        : 8,213,079 B2                                    Page 1 of 1
APPLICATION NO.   : 13/008282
DATED             : July 3, 2012
INVENTOR(S)       : Daniel Kraehmer and Ralf Mueller It is certified that error appears in the above-identified patent and that said Letters Patent is hereby corrected as shown below:

Column 1, line 52, delete "telecentry" insert --telecentricity--.

Column 7, line 48, delete "being" insert --is--.

Column 8, line 21, delete "Z9 =6r$^4$" insert --Z9 = 6r$^4$--.

Signed and Sealed this
Eighteenth Day of September, 2012

David J. Kappos
*Director of the United States Patent and Trademark Office*